United States Patent [19]

Kruehler et al.

[11] Patent Number: 4,657,603
[45] Date of Patent: Apr. 14, 1987

[54] METHOD FOR THE MANUFACTURE OF GALLIUM ARSENIDE THIN FILM SOLAR CELLS

[75] Inventors: Wolfgang Kruehler, Unterhaching; Josef Grabmaier, Berg, both of Fed. Rep. of Germany

[73] Assignee: Siemens Aktiengesellschaft, Berlin and Munich, Fed. Rep. of Germany

[21] Appl. No.: 778,487

[22] Filed: Sep. 20, 1985

[30] Foreign Application Priority Data

Oct. 10, 1984 [DE] Fed. Rep. of Germany ....... 3437233

[51] Int. Cl.$^4$ ............................................. H01L 31/18
[52] U.S. Cl. .................................... 148/175; 29/572; 136/258; 136/262; 148/1.5; 148/DIG. 48; 148/DIG. 56; 148/DIG. 90; 148/DIG. 152; 148/DIG. 153; 427/74; 427/87; 357/30; 357/59
[58] Field of Search ........... 29/572; 136/262, 258 PC; 148/1.5, 175, DIG. 48, DIG. 56, DIG. 90, DIG. 152, DIG. 153, DIG. 65, DIG. 66; 427/39, 74, 86, 87; 219/121 L, 121 LE, 121 LF; 357/59 D, 30

[56] References Cited

U.S. PATENT DOCUMENTS

| | | | |
|---|---|---|---|
| 4,053,350 | 10/1977 | Olsen et al. | 156/659 |
| 4,370,510 | 1/1983 | Stirn | 136/262 |
| 4,392,297 | 7/1983 | Little | 29/572 |

OTHER PUBLICATIONS

S. S. Chu et al., *J. Appl. Phys.*, vol. 48, pp. 4848–4849, (1977).
B-Y. Tsaur et al., *Appl. Phys. Lett.*, vol. 41, pp. 347–349, (1982).

*Primary Examiner*—Aaron Weisstuch

[57] ABSTRACT

A method for the manufacture of gallium arsenide thin film solar cells on inexpensive substrate material whereby an intermediate layer of highly doped, amorphous germanium is employed in order to promote the growth of the gallium arsenide layers. A high-energy radiation is directed to specific, prescribed points on the highly doped, amorphous germanium layer thereby generating centers having a defined crystal orientation, so that the epitaxial layer spreads laterally from these centers in a surface-covering fashion during the epitaxial vapor phase deposition. The solar cells produced by designational grain growth can be manufactured with high purity in a simple way and have an efficiency (greater than 20%) comparable to known mono-crystalline solar cells.

20 Claims, 1 Drawing Figure

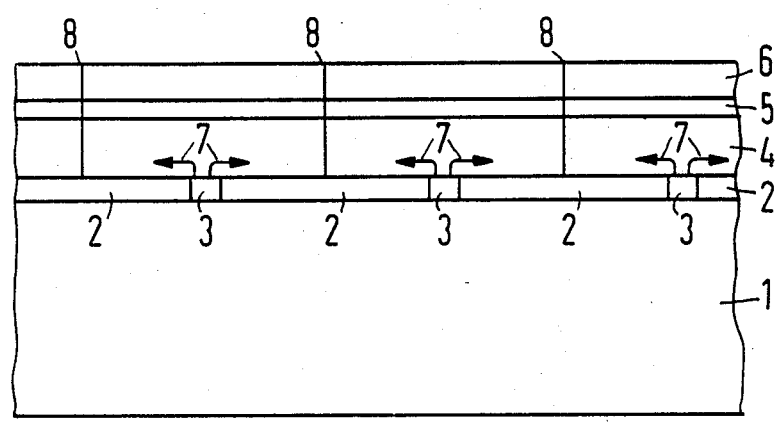

METHOD FOR THE MANUFACTURE OF GALLIUM ARSENIDE THIN FILM SOLAR CELLS

BACKGROUND OF THE INVENTION

1. Field of the Invention

The present invention relates to a method for the manufacture of gallium arsenide thin film solar cells and in particular to a method wherein a germanium layer is applied to the substrate before the gallium arsenide layers are applied.

2. Description of the Prior Art

Research to develop a solar cell having a high conversion efficieny, efficiencies of higher than 20%, that is inexpensive to manufacture, and that is stable has not led to any satisfactory result. One such result, a thin film solar cell of amorphous silicon, can be cost-favorably manufactured by a glow discharge method, but these cells are unstable and have a very low conversion efficiency, roughly 5%.

Another such result, a crystalline silicon solar cell can also be cost-favorably manufactured in band or film form by growing the crystals using a high growth rate, but these cells have a low conversion efficiency. However, a high conversion efficiency can be obtained for these cells if the crystalline silicon solar cells are produced in accord with conventional crystal growing methods, that is, using a low growth rate. This in turn renders the cells relatively expensive to manufacture and unsuitable for mass production.

Another important factor to consider when manufacturing crystalline solar cells is the selection of a suitable initial material. This material should be inexpensive, simple to work with and have the purity appropriate to achieve a high conversion efficiency.

While thin film solar cells of gallium arsenide have a higher theoretical conversion efficiency (24 to 28%) than the aforementioned silicon solar cells, the manufacture of gallium arsenide epitaxy layers with an adequate grain size, preferably in columnar structure, presents difficulties. Also, the selection of an inexpensive substrate material having lattice matching properties is a further problem.

It would therefor be an improvement in this art to manufacture a solar cell which is stable, has a high conversion efficiency, and is inexpensive.

SUMMARY OF THE INVENTION

It is an object of the present invention to provide a method for the manufacture of a solar cell having a high conversion efficiency, and which is stable and inexpensive to manufacture.

It is a further object of the present invention to provide a method of making solar cells utilizing gallium arsenide as a semi-conductor body.

In accordance with the foregoing objectives, the present invention provides a method where a highly doped germanium layer is deposited, in its amorphous state, on an inexpensive substrate, such as metallized glass or planar silicon. The amorphous germanium layer is then divided into zones having a defined crystal orientation by irradiating the layer with high-energy radiation at defined, prescribed points. A vapor phase epitaxy is then performed originating at these prescribed points, wherein the parameters of the epitaxy are set such that, proceeding from the prescribed points, the epitaxial layer laterally spreads in surface-covering fashion until the crystallization fronts of neighboring zones meet.

The invention thereby utilizes the perception gained from the article by Shirley S. Chu et al., *Journal of Applied Physics,* Vol. 48, No. 11, November 1977, pages 4848-49, of promoting the growth of gallium arsenide layers on recrystallized germanium layers. The present method calls for the use of high-energy radiation for crystallization, whereby the crystallization zones produced, these preferably lying in the region of 100 um, prescribe the grain size of the gallium arsenide epitaxy layers.

DESCRIPTION OF THE PREFERRED EMBODIMENTS

The Figure of the drawings shows a sectional view of a thin film gallium arsenide solar cell produced in accordance with the method of the present invention.

A substrate 1 of, for example, metallized glass or planar silicon produced by tape drawing is used. A highly doped, amorphous germanium layer 2 (a-Ge:P:H) having a phosphorous content of at least 1%, which is formed by the decomposition of $GeH_4$ and phosphine ($PH_3$), is deposited in a low-pressure glow discharge reactor in a layer thickness of 0.2-0.5 um.

This germanium-phosphorous layer 2 is crystallized into zones, germanium having <001> and <111> preferred orientations, at specific, prescribed points 3 by using a pulsed or continuous wave laser having a suitable wavelength, in the region of 1 um for germanium. This crystallization can also be achieved at the points 3 by using an electron beam.

Next, a gallium arsenide epitaxy suitable for the manufacture of solar cells is executed in a known fashion, for example from the metallo-organic compound $Ga(CH_3)_3$ and arsine ($AsH_3$) or from arsine and gallium trichloride ($GaCl_3$), the accretion performed at the crystallization points 3. Deposition of a gallium arsenide layer 4 on the amorphous regions of the germanium-phosphorous layer 2 cannot occur due to the lack of lattice matching between the two layers.

The gallium arsenide layer 4, proceeding from the prescribed crystallization points 3, each point being about 5 um long and spaced from the adjacent point a distance in the range between 20 and 1000 um, preferably of 100-200 um between each point, spreads laterally in the directions of arrows 7 in a surface-covering fashion until the crystallization fronts of neighboring zones in the germanium phosphorous layer 2 meet. The growth surfaces are of either <001> or <111> preferred crystallization orientation. Grain boundaries 8 arise at the meeting points of the crystallization fronts, but these boundaries are formed perpendicularly or nearly perpendicularly to the substrate surface 1. Thus, these boundaries do not exert any noteworthy harmful effect on the current collecting properties of the solar cell. Furthermore, the grain boundaries 8 can be passivated by the hydrogen diffusing out of the amorphous germanium-phosphorous layer 2 during the epitaxy.

When the deposition of the gallium arsenide is performed at temperatures between 700° and 800° C., the gallium arsenide is deposited in crystalline form. Also, the amorphous germanium can crystallize at these temperatures, thereby promoting the gallium arsenide grain growth. The highly doped germanium-phosphorous layer 2 forms the ohmic contact of the gallium arsenide solar cell to the substrate 1.

The spacings between adjacent crystallization points 3 generated by the laser are selected in the region of 100 um because these points will determine the grain site. The first gallium arsenide layer 4 is deposited in a layer thickness of 3-5 um. This first layer is doped with zinc and is n-type conductive. A second gallium arsenide layer 5 is deposited on this first layer in a known fashion having a layer thickness of 0.2-1 um. This second layer is doped with tin and is p-type conductive. Finally, this arrangement is covered with a gallium aluminum arsenide mixed crystal layer 6. The gallium aluminum arsenide layer 6, having a layer thickness of 0.5-1 um, is p-type conductive and serves as a window layer. It broadens the band gap between the conduction band and the valency band and prevents surface recombination.

Because the individual process steps are executed successively in a closed system by simply connecting the various reaction gases, a high purity of the amorphous, highly doped germanium layer 2 is assured in a cost-favorable manner. This means that the otherwise sensitive gallium arsenide vapor phase epitaxy will not be initiated by disruptive foreign nuclei.

Although other modifications and changes may be suggested by those skilled in the art, it is the intention of the inventors to embody within the patent warranted hereon all changes and modifications as reasonably and properly come within their contribution to the art.

We claim as our invention:

1. A method for the manufacture of gallium arsenide thin film solar cells comprising:
   depositing a highly doped amorphous germanium layer on a substrate;
   dividing said germanium layer into zones at prescribed points, said zones having a defined crystal orientation; and
   performing a vapor phase epitaxy of gallium arsenide.

2. The method of claim 1 wherein said substrate is selected from the group consisting of metallized glass and planar silicon.

3. The method of claim 1 wherein said germanium layer comprises germanium and at least 1% phosphorus.

4. The method of claim 3 wherein said germanium layer is generated by decomposing a gas mixture comprising $GeH_4$ and $PH_3$ in a low pressure glow discharge reactor.

5. The method of claim 4 wherein said germanium layer has a layer thickness of 0.2-0.5 um.

6. The method of claim 1 wherein a means of high-energy radiation used to generate said zones is electron radiation.

7. The method of claim 1 wherein a means of high-energy radiation used to generate said zones is a pulsed or continuous wave laser having a wavelength lying in the region of 1 um.

8. The method of claim 1 wherein said defined crystal orientation of said zones includes <001> and <111> orientations.

9. The method of claim 1 wherein said zones are spaced 20-1000 um apart.

10. The method of claim 1 wherein the parameters of said epitaxy are set such that the epitaxial layer laterally spreads over the surface until the crystallization fronts of neighboring zones meet.

11. The method of claim 1 where, in said gallium arsenide epitaxy, the reaction gas used includes a mixture of arsine ($AsH_3$) and a gallium containing material.

12. The method of claim 11 wherein said gallium containing material is trimethyl gallium.

13. The method of claim 1 wherein said gallium arsenide epitaxy is executed at a temperature of 700°-800° C.

14. The method of claim 1 wherein a plurality of layers are deposited by said epitaxy.

15. The method of claim 14 wherein a first gallium arsenide layer is doped with zinc and is n-type conductive.

16. The method of claim 15 wherein said first gallium arsenide layer is deposited in a layer thickness of 3-5 um.

17. The method of claim 14 wherein a second gallium arsenide layer is doped with tin and is p-type conductive.

18. The method of claim 17 wherein said second gallium arsenide layer is deposited in a layer thickness of 0.2-1 um.

19. A method for the manufacture of gallium arsenide thin film solar cells, comprising:
   depositing a highly doped germanium layer in its amorphous state, and having at least a 1% phosphorous content, on a substrate;
   dividing said germanium layer into zones having a defined crystal orientation at prescribed points by means of high-energy radiation, and
   performing a vapor phase epitaxy of gallium arsenide at said prescribed points to deposit gallium arsenide layers, and a gallium aluminum arsenic mixed crystal layer.

20. A method for the manufacture of gallium arsenide thin film solar cells comprising:
   forming a highly doped germanium layer by decomposing a gas mixture of $GeH_4$ and $PH_3$ in a low pressure discharge reactor;
   depositing said germanium layer in its amorphous state on a substrate;
   crystallizing said germanium layer into zones of preferred crystal orientations by applying high-energy radiation at specific, prescribed points;
   performing a gallium arsenide epitaxy on said germanium layer wherein the accretion is performed at said prescribed points;
   said epitaxy creating an n-type conductive first gallium arsenide layer doped with zinc;
   a p-type conductive second gallium arsenide layer doped with tin; and
   a p-type conductive gallium aluminum arsenic mixed crystal layer.

* * * * *